(12) United States Patent
Wada et al.

(10) Patent No.: US 6,518,790 B2
(45) Date of Patent: Feb. 11, 2003

(54) SEMICONDUCTOR INTEGRATED CIRCUIT HAVING CIRCUIT FOR TRANSMITTING INPUT SIGNAL

(75) Inventors: Yoshiki Wada, Hyogo (JP); Harufusa Kondoh, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/940,622

(22) Filed: Aug. 29, 2001

(65) Prior Publication Data

US 2002/0043671 A1 Apr. 18, 2002

(30) Foreign Application Priority Data

Aug. 31, 2000 (JP) ........................................ 2000-262444
Jul. 2, 2001 (JP) ........................................ 2001-200683

(51) Int. Cl.[7] ..................................... H03K 19/0175
(52) U.S. Cl. ............................ 326/81; 326/68; 326/83; 326/80
(58) Field of Search ............................. 326/63, 68, 80, 326/81, 83, 86

(56) References Cited

U.S. PATENT DOCUMENTS

| 5,146,111 | A | * | 9/1992 | Ciraula et al. ............ 307/296.3 |
| 6,285,213 | B1 | * | 9/2001 | Makino ........................ 326/81 |
| 6,304,105 | B1 | * | 10/2001 | Fujiyoshi ...................... 326/81 |

FOREIGN PATENT DOCUMENTS

| JP | 5-343980 | 12/1993 |
| JP | 8-307236 | 11/1996 |

* cited by examiner

Primary Examiner—Michael Tokar
Assistant Examiner—Anh Tran
(74) Attorney, Agent, or Firm—McDermott, Will & Emery

(57) ABSTRACT

A semiconductor integrated circuit includes inverters and a PMOS transistor which are disposed for a first signal, and inverters and a PMOS transistor which are disposed for a second signal substantially complementary to the first signal. By the transistors, potentials of signal lines are driven. A transistor for 1.8 V is used for each of the transistors and the inverters at the rear stage. A transistor for 3.3 V is used for each of the inverters at the front stage. With the configuration, the complementary signals are transmitted at optimum timings.

15 Claims, 8 Drawing Sheets

US 6,518,790 B2

SEMICONDUCTOR INTEGRATED CIRCUIT HAVING CIRCUIT FOR TRANSMITTING INPUT SIGNAL

BACKGROUND OF THE INVENTION

1. Field of the Invention

The present invention relates to a semiconductor integrated circuit and, more particularly, to a semiconductor integrated circuit having a circuit configuration for transmitting complementary signals.

2. Description of the Background Art

In an LSI (Large-Scale Integration), there is a case where a power supply voltage of an input/output buffer for transmitting/receiving a signal to/from the outside is different from that of an internal circuit for processing the signal. More specifically, there is a case where a high voltage is applied to the input/output buffer and a low voltage is applied to the internal circuit.

By setting the voltage supplied to the internal circuit to a low value, the following effects can be obtained. First, power consumption in the internal circuit can be suppressed. Second, when the voltage is lowered, an issue of a withstand voltage in a gate electrode of a transistor can be lightened. Consequently, the thickness of a gate oxide film in a transistor as a component of the internal circuit can be reduced. Third, by reducing the thickness of the gate oxide film, it is expected to increase the operating speed of the internal circuit.

In the case of supplying a high voltage to the input/output buffer and a low voltage to the internal circuit, a transistor having a thick gate oxide film has to be used for the input/output buffer and a transistor having a thin gate oxide film has to be used for a thin gate oxide film. At the time of supplying a signal to the internal circuit, the voltage of the signal has to be changed.

The configuration of the main portion of a conventional semiconductor integrated circuit will now be described with reference to FIG. 8. In the following, a CMOS (Complementary Metal-Oxide Semiconductor) LSI in which a power supply voltage at an input stage is 3.3 V and a power supply voltage in an internal circuit is 1.8 V will be described as an example. Each of input and output signals of the internal circuit is set at. a CMOS level.

The conventional semiconductor integrated circuit shown in FIG. 8 has: voltage transforming circuits 910 and 920 which receive signals IN and /IN complementary to each other supplied from the outside, respectively; and a signal transmitting circuit 900 including CMOS inverters 930 and 940 for inverting outputs of the voltage transforming circuits 910 and 920, signal lines L3 and L4, and CMOS inverters 950 and 960 for inverting outputs of the inverters 930 and 940. Outputs of the signal transmitting circuit 900 are supplied to an internal circuit (not shown) operated from a 1.8 V power supply.

The voltage transforming circuits 910 and 920 operate so as to drop the H level of the signals IN and /IN to around 1.8 V. The inverter 930 includes a PMOS transistor 803 and an NMOS transistor 804 each having a gate connected to an output node 801 of the voltage transforming circuit 910. The transistor 803 is connected between a power supply voltage of 1.8 V and a node 807. The transistor 804 is connected between a ground voltage and the node 807 (signal line L3).

The inverter 940 includes a PMOS transistor 805 and an NMOS transistor 806 each having a gate connected to an output node 802 of the voltage transforming circuit 920. The transistor 805 is connected between a power supply voltage of 1.8 V and a node 808. The transistor 806 is connected between a ground voltage and the node 808 (signal line L4).

The inverter 950 includes a PMOS transistor 811 and an NMOS transistor 812 each having a gate connected to the signal line L3. The transistor 811 is connected between a power supply voltage of 1.8 V and a node 115. The transistor 812 is connected between a ground voltage and the node 115.

The inverter 960 includes a PMOS transistor 813 and an NMOS transistor 814 each having a gate connected to the signal line L4. The transistor 813 is connected between a power supply voltage of 1.8 V and a node 116. The transistor 814 is connected between a ground voltage and the node 116.

When the H level of an output of each of the voltage transforming circuits 910 and 920 does not drop to 1.8 V, the output cannot be received by the transistor having the thin gate oxide film. The inverter 930 is therefore constructed by the transistors 803 and 804 adapted to 3.3 V and uses the power supply voltage of 1.8 V. Similarly, the inverter 940 is constructed by the transistors 805 and 806 adapted to 3.3 V and uses the power supply voltage of 1.8 V. On the other hand, a transistor adapted to 1.8 V is used as each of the transistors 811 to 814. To an internal circuit (not shown), signals of the nodes 115 and 116 are supplied.

The circuit configuration, however, has the following problems. When a deviation occurs between complementary signals, the deviation cannot be compensated by the cascaded configuration of the inverters.

The drivability of the transistor for 3.3 V is low (particularly, the drivability of a PMOS transistor is lower than that of an NMOS transistor). In order to raise the drivability, it is therefore necessary to widen the gate width of the transistor. When the drivability is compensated by the gate width, the gate width of the transistor is widened. It accordingly increases layout area and parasitic capacitance.

Generally, a transistor having high withstand voltage has a high threshold voltage relative to the withstand voltage. Specifically, a transistor for 3.3 V has a threshold voltage higher than that of a transistor for 1.8 V. An operating current (source-drain current) of a MOS transistor depends on a difference (Vgs−Vt) between a gate-source voltage Vgs and a threshold voltage Vt.

In inverters 930 and 940 constructed by the transistors for 3.3 V but driven on the source voltage of 1.8 V, therefore, the operating current of each of the MOS transistors cannot be sufficiently obtained. As a result, it deteriorates the operating speed of signal transmitting circuit 900.

As the amplitude of an output signal required by signal transmitting circuit 900, that is, the source voltage (1.8 V) of an internal circuit decreases, the more the problem becomes conspicuous. Particularly, when the source voltage of the internal circuit becomes lower than the threshold voltage of the transistors for 3.3 V for receiving outputs of voltage transforming circuits 910 and 920 at the front stage, signal transmitting circuit 900 becomes inoperable.

SUMMARY OF THE INVENTION

The present invention provides a semiconductor integrated circuit having a circuit capable of transmitting complementary signals at optimum timings without enlarging a layout area.

The present invention also provides a semiconductor integrated circuit having a circuit for changing the voltage amplitude of an input signal at high speed.

A semiconductor integrated circuit according to the present invention comprises: a first signal line for transmitting a first signal; a second signal line for transmitting a second signal substantially complementary to the first signal; first and second MOS transistors cross coupled between the first and second signal lines; a first logic gate including a third MOS transistor which receives a signal of the first signal line by its gate; and a second logic gate including a fourth MOS transistor which receives a signal of the second signal line by its gate.

Preferably, the semiconductor integrated circuit further has: a first terminal for receiving the first signal; a second terminal for receiving the second signal; a third logic gate including a fifth MOS transistor which is connected between the first terminal and the first signal line and is formed under process parameters different from those of the first to fourth MOS transistors; and a fourth logic gate including a sixth MOS transistor which is connected between the second terminal and the second signal line and is formed under process parameters different from those of the first to fourth MOS transistors.

Particularly, each of the first and second MOS transistors has a gate oxide film of which thickness is different from that of a gate oxide film in each of the fifth and sixth MOS transistors.

Particularly, a withstand voltage of each of the first and second MOS transistors is different from that of each of the fifth and sixth MOS transistors.

Particularly, the first and second MOS transistors are PMOS transistors, the first MOS transistor is connected between a power supply voltage line and the first signal line and its gate is connected to the second signal line, and the second MOS transistor is connected between the power supply voltage line and the second signal line and its gate is connected to the first signal line.

Particularly, the first and second MOS transistors are NMOS transistors, the first MOS transistor is connected between a ground voltage line and the first signal line and its gate is connected to the second signal line. The second MOS transistor is connected between the ground voltage line and the second signal line and its gate is connected to the first signal line.

Preferably, the first logic gate includes a seventh MOS transistor of a conductive type opposite to that of the third MOS transistor. The seventh and third MOS transistors form a first CMOS inverter. The second logic gate includes an eighth MOS transistor of a conductive type opposite to that of the fourth MOS transistor. The eighth and fourth MOS transistors form a second CMOS inverter. The third logic gate includes a ninth MOS transistor of a conductive type opposite to that of the fifth MOS transistor. The ninth and fifth MOS transistors form a third CMOS inverter. The fourth logic gate includes a tenth MOS transistor of a conductive type opposite to that of the sixth MOS transistor. The tenth and sixth MOS transistors form a fourth CMOS inverter.

In the semiconductor integrated circuit, therefore, the potentials of the signal lines can be driven at high speed by the cross-coupled MOS transistors which are disposed for the signal lines for transmitting signals which are complementary to each other. Consequently, a timing deviation between the complementary signals can be corrected.

Transistors each having a thick gate oxide film are used for the gate at the front stage, and transistors each having a thin gate oxide film are used for the gate at the rear stage and as the MOS transistors cross coupled. Alternately, transistors each having a withstand voltage higher than that of each of transistors used for the gate at the rear stage and as the cross-coupled MOS transistors are used for the gate at the front stage. With the configuration, even when the drivability of the gate at the front stage is low, the drivability can be compensated by the cross-coupled MOS transistors.

Another semiconductor integrated circuit of the invention has: a first signal line for transmitting an input signal set to have a first or second voltage; a second signal line for transmitting an level-shifted input signal which is set to have a second or third voltage; a first logic gate driven on the second and third voltages, for connecting one of the second and third voltages to a first node in response to the input signal; a level shifting auxiliary unit which operates in response to an inverted input signal and is activated when the first node and the third voltage are connected to each other by the first logic gate, to connect the third voltage and the first node; and a second logic gate driven on the second and third voltages, for connecting one of the second and third voltages to the second signal line in accordance with a voltage at the first node.

Preferably, the semiconductor integrated circuit further includes a leak current preventing unit for making the level shifting auxiliary unit inactive to isolate the third voltage and the first node from each other in the case where the first node and the second voltage are connected to each other by the first logic gate.

Preferably, a third logic gate driven by the first and second voltages, for inverting the input signal is further provided.

Preferably, the first logic gate includes a first MOS transistor for receiving the input signal by its gate; the second logic gate includes a second MOS transistor having a gate connected to the first node, the level shifting auxiliary unit includes a third logic gate for connecting the third or second voltage and a second node in accordance with the inverted input signal, and a third MOS transistor which has a gate connected to the second node and is connected between the third voltage and the first node, the third logic gate has a fourth MOS transistor for receiving the inverted input signal by its gate, and the first and fourth MOS transistors and the second and third MOS transistors are formed under different process parameters.

Particularly, the thickness of a gate oxide film of each of the first and fourth MOS transistors is different from that of each of the second and third MOS transistors.

Particularly, a withstand voltage of each of the first and fourth MOS transistors is different from that of each of the second and third MOS transistors.

Particularly, the semiconductor integrated circuit further includes a fifth MOS transistor which has a gate connected to the first node and is connected between the third voltage and the second node. The third and fifth MOS transistors are turned on/off complementarily to each other.

Particularly, the fifth MOS transistor is formed under process parameters similar to those of the third MOS transistor.

Preferably, the first and second logic gates are inverters.

Consequently, in the semiconductor integrated circuit, even when an input signal having a voltage level by which the operating speed of the first logic gate decreases is input, in response to the inverted input signal, the potential of the signal line can be driven by the MOS transistor as a component of the level shifting auxiliary unit. Thus, the level of an input signal can be shifted at high speed. Since the driving capability of the MOS transistor as a component of the first logic gate can be compensated, the gate width of the MOS transistor can be narrowed, so that the layout area and the parasitic capacity can be suppressed.

In the case where an input signal of the voltage level by which the operating speed of the logic gate does not decrease is input, the MOS transistor as a component of the level shifting auxiliary unit can be promptly turned off. With the configuration, the occurrence of a leak current can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
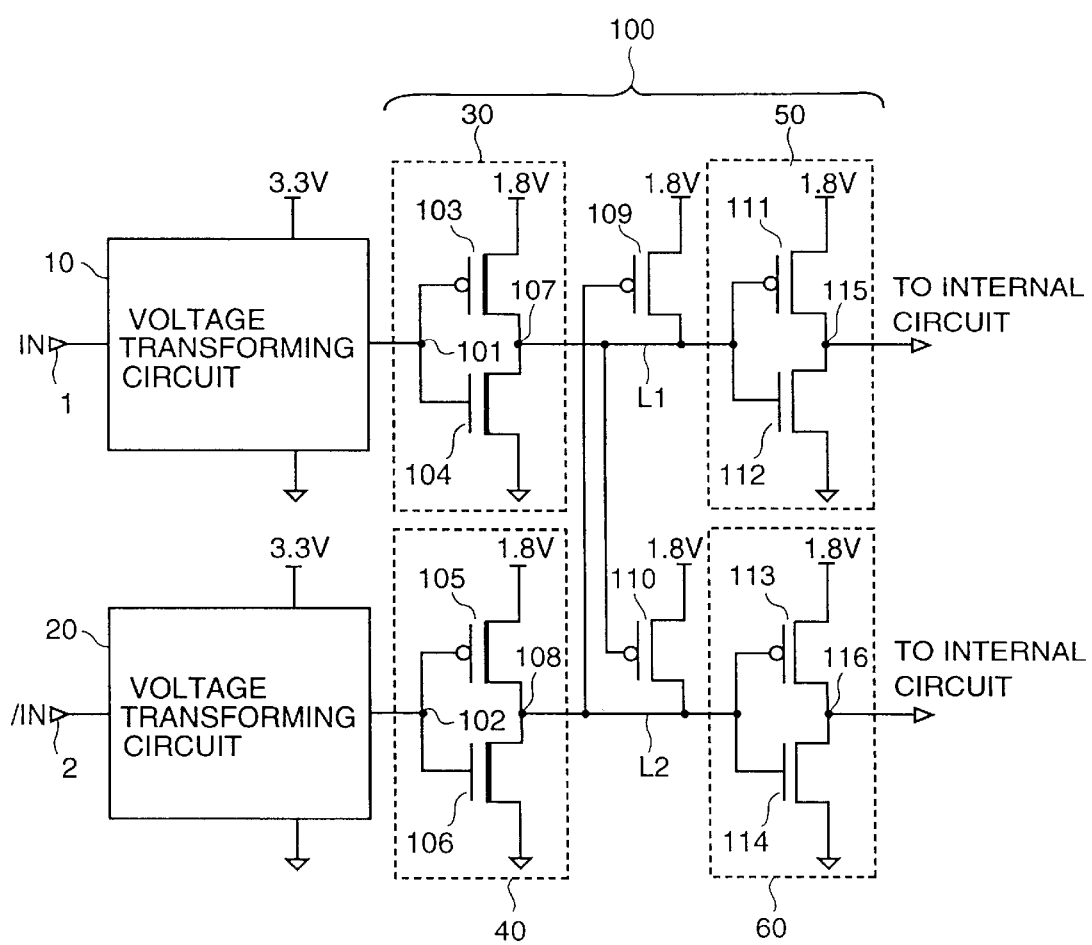
FIG. 1 is a diagram showing the configuration of a signal transmitting circuit 100 according to a first embodiment.

Embodiments of the invention will be described hereinbelow with reference to the drawings. The same or corresponding components are designated by the same reference numerals and their description will not be repeated.

First Embodiment

The configuration according to a first embodiment will be described with reference to FIGS. 1 and 2. A semiconductor integrated circuit 1000 according to the first embodiment has: a voltage transforming circuit 10 for transforming a voltage of a signal IN received by a node 1; a voltage transforming circuit 20 for transforming a voltage of a signal /IN substantially complementary to the signal IN; and a signal transmitting circuit 100 including a CMOS inverter 30 for inverting a signal of an output node 101 of the voltage transforming circuit 10 and a CMOS inverter 40 for inverting a signal of an output node 102 of the voltage transforming circuit 20.

The signals IN and /IN entered from the outside of the chip are supplied to the node 1 and a node 2. The voltage transforming circuits 10 and 20 operate from a 3.3 V power supply.

Figure 2:
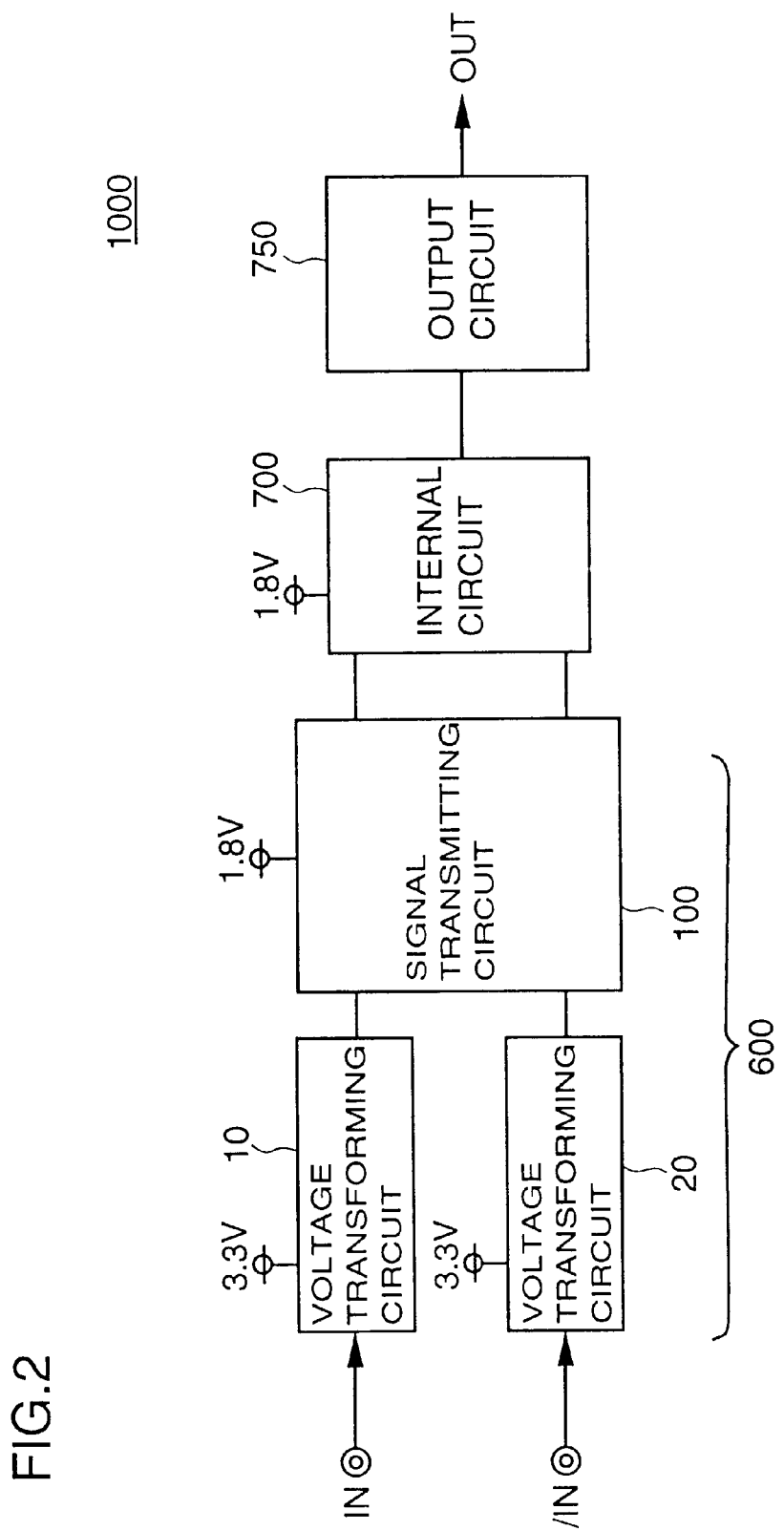
FIG. 2 is a block diagram showing the schematic configuration of a semiconductor integrated circuit 1000 according to the first embodiment.

The signal transmitting circuit 100 is disposed in an input circuit 600 in a semiconductor integrated circuit 1000 shown in FIG. 2. The signals IN and /IN supplied from the outside of the LSI to the terminals IN and /IN are subjected to voltage transformation in the voltage transforming circuits 10 and 20, respectively, each of which is powered by the 3.3 V power supply. Outputs of the voltage transforming circuits 10 and 20 are supplied via the signal transmitting circuit 100 to an internal circuit 700 which operates from a 1.8 V power supply. It is assumed that each of input and output signals of the internal circuit 700 is a CMOS level.

For example, data is written into a memory array included in the internal circuit 700 on the basis of an input signal. Data read from the memory cell array included in the internal circuit 700 is outputted to the outside via an output circuit 750. When the output circuit 750 operates from a 3.3 V power supply, a voltage transforming circuit is disposed between the output circuit 750 and the internal circuit 700.

Referring to FIG. 1, the voltage transforming circuits 10 and 20 operate so as to decrease the voltages of the signals IN and /IN received by the nodes 1 and 2 to about 1.8 V. The signal at the node 101 and that at the node 102 are complementary to each other.

The inverter 30 includes a PMOS transistor 103 and an NMOS transistor 104 each having a gate connected to the node 101. The transistor 103 is connected between a power supply voltage of 1.8 V and a node 107. The transistor 104 is connected between a ground voltage and the node 107.

The inverter 40 includes a PMOS transistor 105 and an NMOS transistor 106 each having a gate connected to the node 102. The transistor 105 is connected between a power supply voltage of 1.8 V and a node 108, and the transistor 106 is connected between a ground voltage and the node 108.

The signal transmitting circuit 100 according to the first embodiment further includes: a signal line L1 connected to the node 107; a signal line L2 connected to the node 108; PMOS transistors 109 and 110 which are cross coupled; a CMOS inverter 50 for inverting a signal of the signal line L1; and a CMOS inverter 60 for inverting a signal of the signal line L2.

The transistor 109 is connected between a power supply voltage of 1.8 V and the signal line L1 and its gate is connected to the signal line L2. The transistor 110 is connected between a power supply voltage of 1.8 V and the signal line L2 and its gate is connected to the signal line L1.

The inverter 50 includes a PMOS transistor 111 and an NMOS transistor 112 each having a gate connected to the signal line L1. The transistor 111 is connected between a power supply voltage of 1.8 V and a node 115. The transistor 112 is connected between a ground voltage and the node 115.

The inverter 60 includes a PMOS transistor 113 and an NMOS transistor 114 each having a gate connected to the signal line L2. The transistor 113 is connected between a power supply voltage of 1.8 V and a node 116. The transistor 114 is connected between a ground voltage and the node 116.

Transistors used in the inverter 30 and those used in the inverter 50 are formed under different process parameters. Similarly, transistors used in the inverter 40 and those used in the inverter 60 are formed under different process parameters.

Between the inverters 30, 40 and the inverters 50, 60 which are formed under different process parameters, the transistors 109 and 110 formed under process parameters which are substantially the same as those of the inverters 50 and 60 are disposed.

More specifically, a transistor having a relatively thick gate oxide film for 3.3 V and/or having a high withstand voltage is used as each of the transistors 103, 104, 105 and 106. A transistor having a relatively thin gate oxide film for 1.8 V and/or having a low withstand voltage is used as each of the transistors 109, 110, 111, 112, 113, and 114.

In the case where the cross coupled configuration is eliminated from the configuration of FIG. 1, due to low drivability of the transistors for 3.3 V (especially, the PMOS transistors) constructing the inverters 30 and 40, the gate width of each of the transistors has to be widened.

In the case of employing the configuration according to the first embodiment, however, the signal at the node 101 and that at the node 102 are complementary to each other. When the signal at the node 101 changes from the "H" level to the "L" level, the signal at the node 102 simultaneously changes from the "L" level to the "H" level. In association with the change, the signal at the node 107 changes from the "L" level to the "H" level and the signal at the node 108 changes from the "H" level to the "L" level.

When the voltage level of the signal line L2 drops, the voltage of the signal line L1 is pulled up to the H level by the transistor 109. Similarly, when the voltage level of the signal line L1 drops, the voltage of the signal line L2 is pulled up to the H level by the transistor 110.

That is, in the configuration according to the first embodiment, the drivability of each of the transistors (especially, the transistors 103 and 105) constructing the gates at the front stage can be compensated by potential driving of the cross coupled transistors. The gate width of each of the transistors constructing the gates at the front stage can be therefore narrowed, and the layout area and parasitic capacitance can be suppressed.

Since the power supply voltage of each of the inverters 30 and 40 is 1.8 V, the voltage level at each of the nodes 107 and 108 does not exceed 1.8 V. A transistor for 1.8 V having a thin gate oxide film and high drivability can be therefore used as each of the transistors 109 and 110 and the layout area can be suppressed.

On the other hand, even in the case where the voltage of the input signal cannot be sufficiently decreased in each of the voltage transforming circuits 10 and 20, by increasing the withstand voltages of the transistors 103, 104, 105 and 106, the gate oxide film of each of the transistors is protected.

Further, when the configuration according to the first embodiment is used, a deviation between the complementary signals can be corrected. The correction of a deviation between the complementary signals will be described with reference to FIG. 3.

Figure 3:
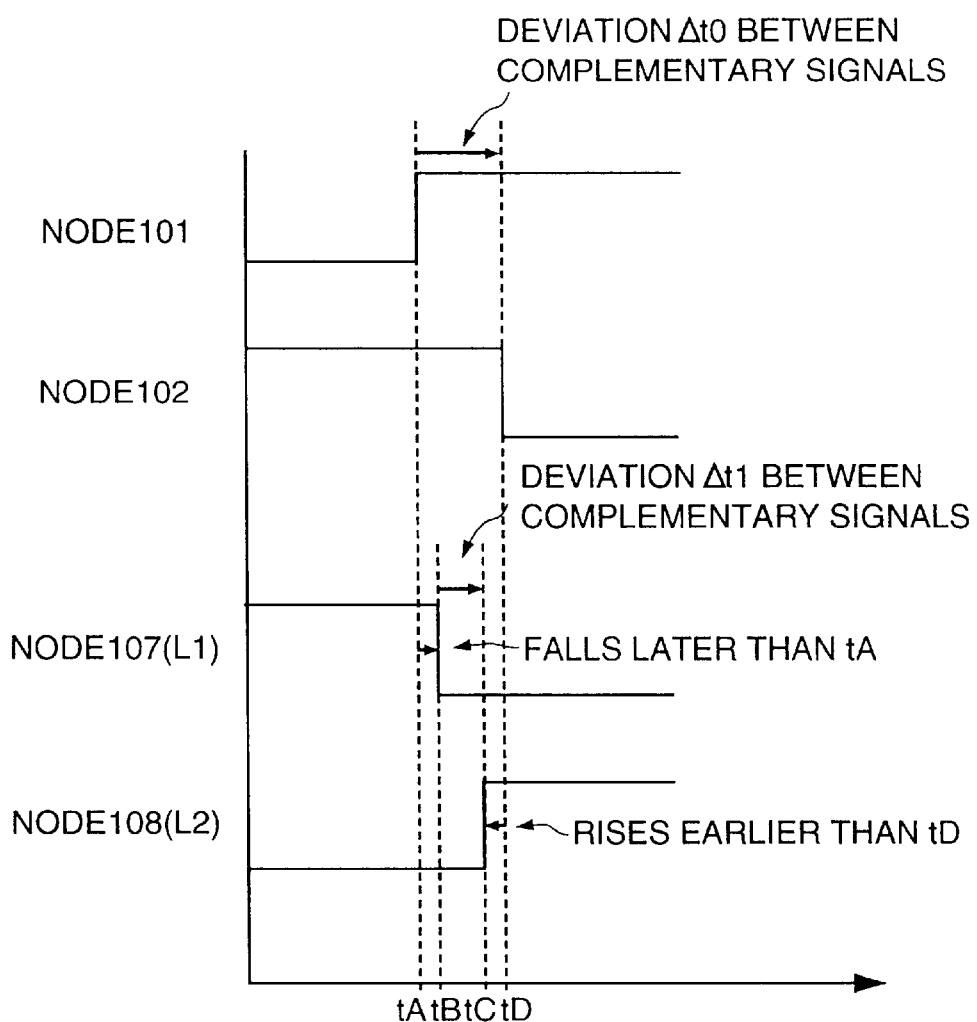
FIG. 3 is a diagram for explaining operations based on the configuration of the first embodiment.

FIG. 3 shows how waveforms of signals at the nodes 107 and 108 change when signals are applied to the nodes 101 and 102.

It is assumed that the level of the node 101 rises from the "L" level to the "H" level at time tA and the level of the node 102 drops from the "H" level to the "L" level at time tD(Δt0=tD−tA), that is, a deviation between complementary signals is Δt0.

Figure 8:
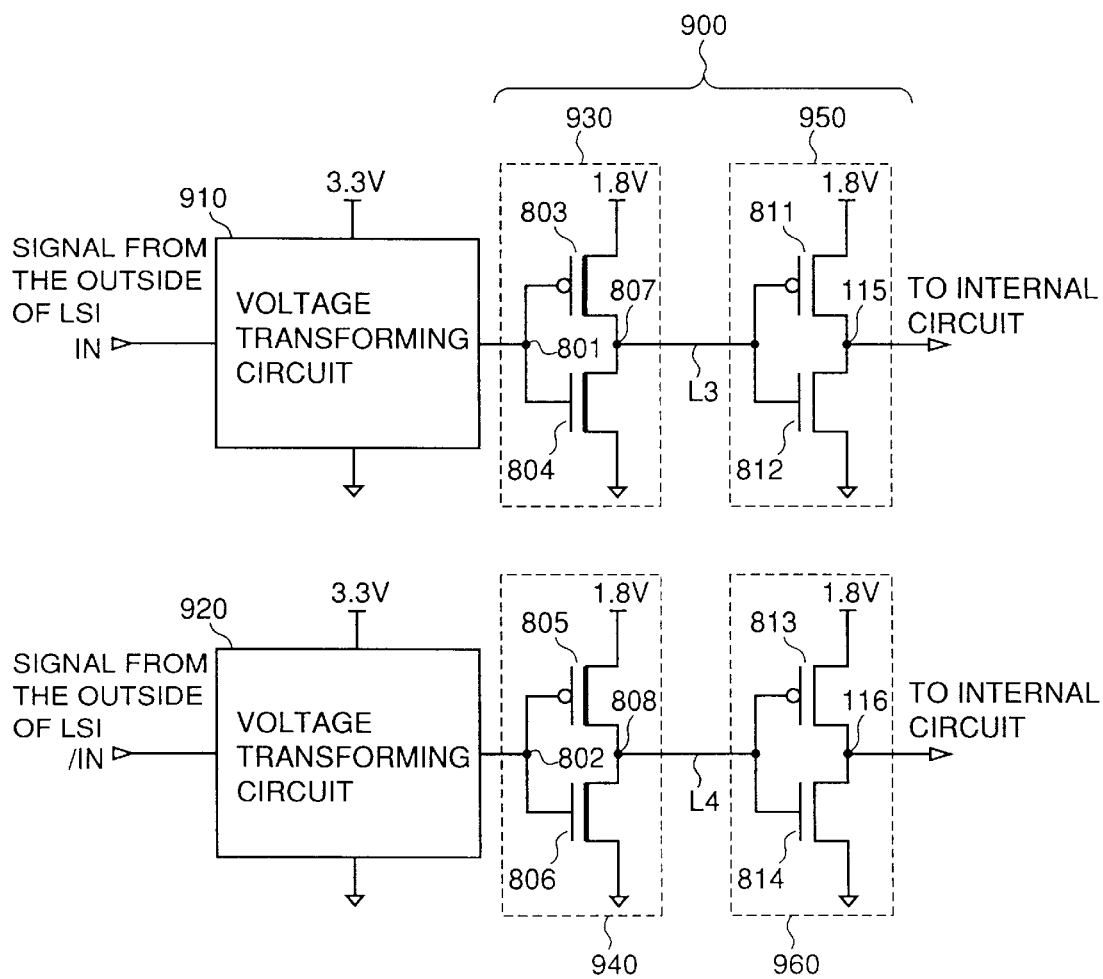
FIG. 8 is a diagram showing the configuration of a conventional signal transmitting circuit 900.

The conventional signal transmitting circuit shown in FIG. 8 does not include the transistors 109 and 110. Consequently, when the deviation between the supplied complementary signals is Δt0, the deviation Δt0 between the complementary signals is held as it is. Accordingly, the deviation between the complementary signals supplied to the internal circuit is Δt0.

On the other hand, in the signal transmitting circuit 100 according to the first embodiment, the node 107 changes from the H level to the L level at time tB later than time tA (tB>tA). When the node 107 changes to the L level, the transistor 110 is turned on. As a result, the node 108 changes from the L level to the H level at time tC (tC=tB+Δt1) earlier than time tD.

The difference between the time at which the level of the node 107 changes and the time at which the level of the node 108 changes is Δt1 which is shorter than that of the conventional circuit.

That is, by passing signals through the signal transmitting circuit 100, the deviation between the complementary signals is corrected and reduced. As a result, an optimum operation in the internal circuit is assured.

Second Embodiment

The configuration of the main portion of a semiconductor integrated circuit according to a second embodiment will be described. In the second embodiment, NMOS transistors which are cross coupled are disposed between two kinds of gates.

Figure 4:
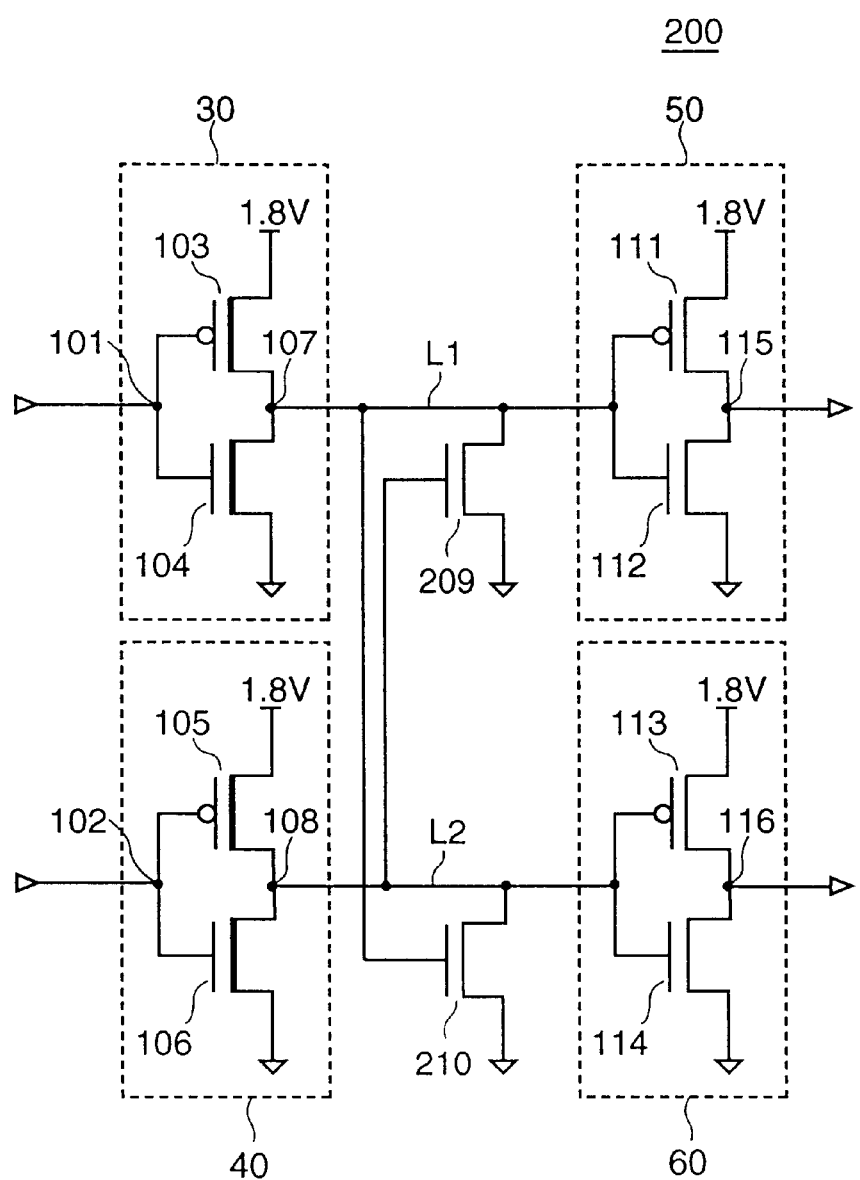
FIG. 4 is a diagram showing the configuration of the main portion of a signal transmitting circuit 200 according to a second embodiment.

Referring to FIG. 4, in a signal transmitting circuit 200 according to a second embodiment, NMOS transistors 209 and 210 formed under substantially the same process parameters as those of the inverters 50 and 60 are disposed between the inverters 30, 40 and the inverters 50, 60. The inverters 30, 40 and the inverters 50, 60 are formed under different process parameters. Specifically, a transistor for 1.8 V is used for each of the inverters 50 and 60 and the NMOS transistors 209 and 210.

The NMOS transistor 209 is connected between a ground voltage and the node 107 and receives a signal from the nose 108 by its gate. The NMOS transistor 210 is connected between a ground voltage and the node 108 and receives a signal from the node 107 by its gate.

When the voltage level of the signal line L2 rises, the voltage level of the signal line L1 is pulled down to the L level by the transistor 209. When the voltage level of the signal line L1 rises, the voltage level of the signal line L2 is pulled down to the L level by the transistor 210.

Even when the drivability of the NMOS transistors in the inverters 30 and 40 is low, the drivability of the NMOS transistors can be therefore compensated without widening the gate width of the transistors 104 and 106. Consequently, the layout area and the parasite capacitance can be reduced.

Further, in the case of using the configuration according to the second embodiment, a deviation between complementary signals can be corrected. The correction of a deviation between complementary signals will now be described with reference to FIG. 5.

Figure 5:
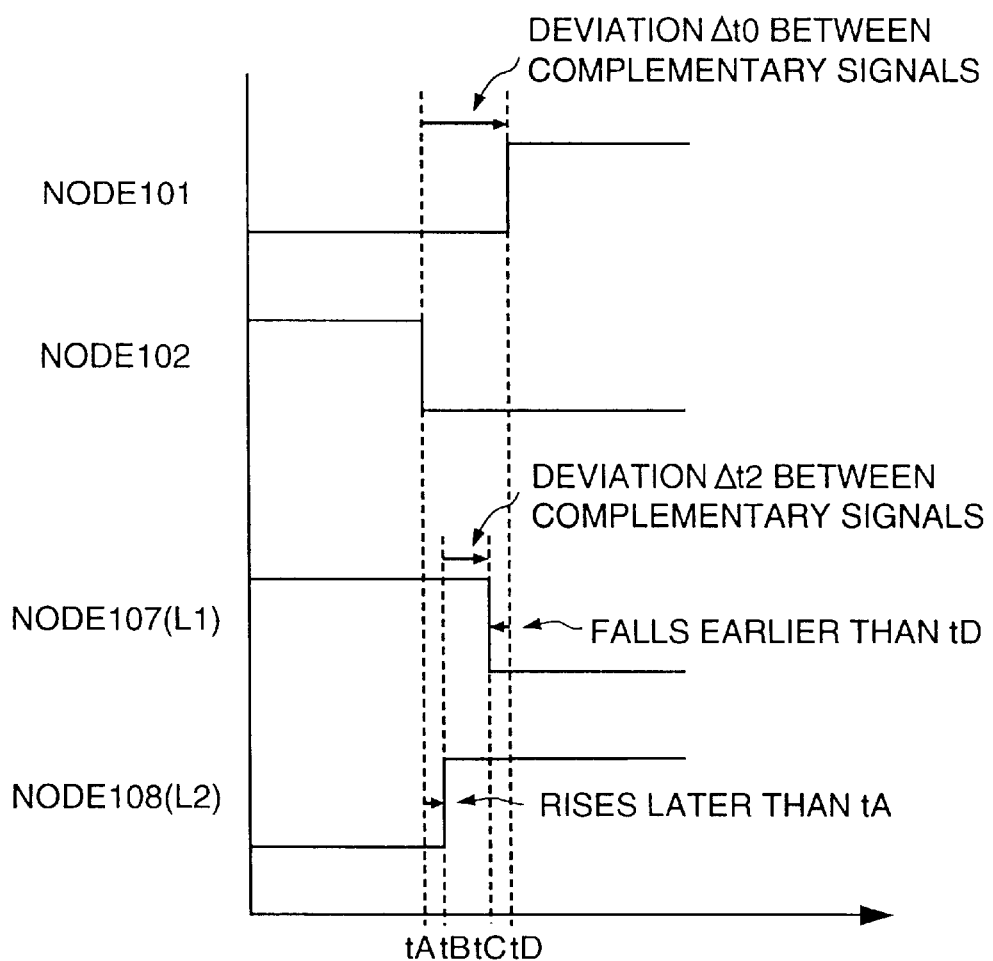
FIG. 5 is a diagram for explaining operations based on the configuration according to the second embodiment.

FIG. 5 shows how signal waveforms at the nodes 107 and 108 change when signals are applied to the nodes 101 and 102.

It is assumed that the level at the node 102 drops from the H level to the L level at time tA and the level at the node 101 rises from the L level to the H level at time tD (Δt0=tD−tA), that is, a deviation between complementary signals is Δt0.

The conventional signal transmitting circuit shown in FIG. 8 does not include the transistors 209 and 210. When the deviation between the input complementary signals is Δt0, the deviation Δt0 between the complementary signals is therefore held as it is. Consequently, the deviation between the complementary signals supplied to the internal circuit is Δt0.

On the other hand, in the signal transmitting circuit 200 according to the second embodiment, the level at the node 108 changes from the L level to the H level at time tB later than time tA (tB>tA). When the level at the node 108 rises to the H level, the transistor 209 is turned on. As a result, the level at the node 107 changes from the H level to the L level at time tC (tC=tB+Δt2) earlier than time tD.

The difference between the time of the level change at the node 107 and that of the level change at the node 108 is Δt2 which is shorter than conventional one.

That is, by passing the signals through the signal transmitting circuit 200, the deviation between complementary signals is corrected and reduced. As a result, an optimum operation is assured in the internal circuit.

Third Embodiment

The configuration of the main portion of a semiconductor integrated circuit according to a third embodiment will be described. In the third embodiment, the configuration of the first embodiment and that of the second embodiment are combined, and PMOS transistors which are cross coupled and NMOS transistors which are cross coupled are disposed between two kinds of gates.

Figure 6:
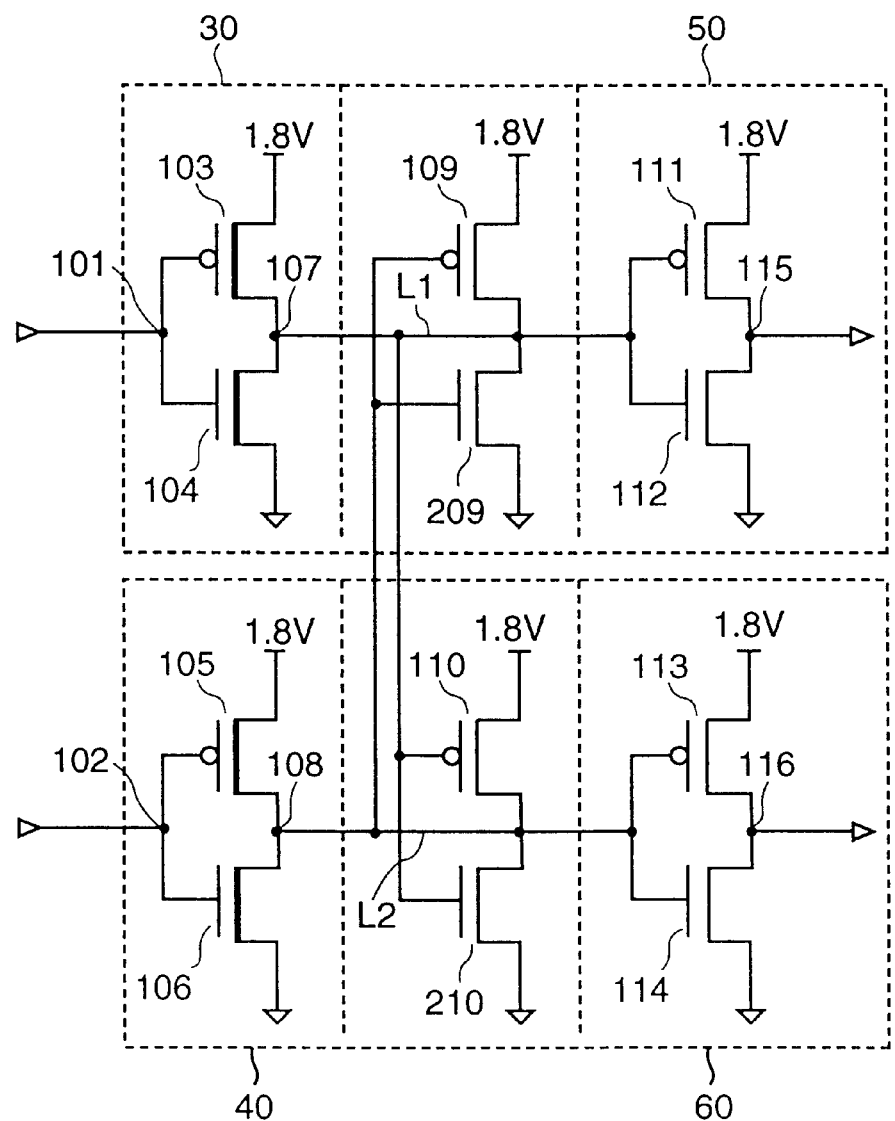
FIG. 6 is a diagram showing the configuration of the main portion of a signal transmitting circuit 300 according to a third embodiment.

Referring to FIG. 6, in a signal transmitting circuit 300 according to the third embodiment, between the inverters 30, 40 and the inverters 50, 60 which are produced under different process parameters, the PMOS transistors 109, 110 and the NMOS transistors 209, 210 which are formed under substantially the same process parameters as those of the inverter 50 and 60 are disposed.

The PMOS transistor 109 is connected between a power supply voltage of 1.8 V and the node 107 and receives a signal from the node 108 by its gate. The PMOS transistor 110 is connected between a power supply voltage of 1.8 V and the node 108 and receives a signal of the node 107 by its gate.

Further, the NMOS transistor 209 is connected between a ground voltage and the node 107 and receives a signal of the node 108 by its gate. The NMOS transistor 209 is connected between a ground voltage and the node 108 and receives a signal of the node 107 by its gate.

When the voltage level of the signal line L2 drops, the voltage level of the signal line L1 is pulled up to the H level by the transistor 109. When the voltage level of the signal line L1 drops, the voltage level of the signal line L2 is pulled up to the H level by the transistor 110.

When the voltage level of the signal line L2 rises, the voltage level of the signal line L1 is pulled down to the L level by the transistor 209. When the voltage level of the signal line L1 rises, the voltage level of the signal line L2 is pulled down to the L level by the transistor 210.

Even when the drivability of the transistor in each of the inverters 30 and 40 is low, the voltage levels of the signal lines L1 and L2 can be driven at high speed by the transistors 109 and 110. Similarly, the voltage levels of the signal lines L1 and L2 can be driven at high speed by the transistors 209 and 210.

Even when the drivability of the transistors in the inverters 30 and 40 is low, the drivability can be compensated without widening the gate width of each of the transistors.

As a result, the size of each of the transistors as components of the inverters 30 and 40 can be reduced. The layout area and parasite capacitance are therefore reduced.

In the signal transmitting circuit 300 according to the third embodiment, the timing deviation between complementary signals can be corrected. Specifically, the effects of the first and second embodiments which have been described by referring to FIGS. 3 and 5 can be produced.

Fourth Embodiment

The configuration of the main portion of a semiconductor integrated circuit according to a fourth embodiment will be described. In the fourth embodiment, the configuration of an input circuit for changing a voltage amplitude of an input signal at high speed, which can deal with not only complementary signals but also a single input signal will be described.

Figure 7:
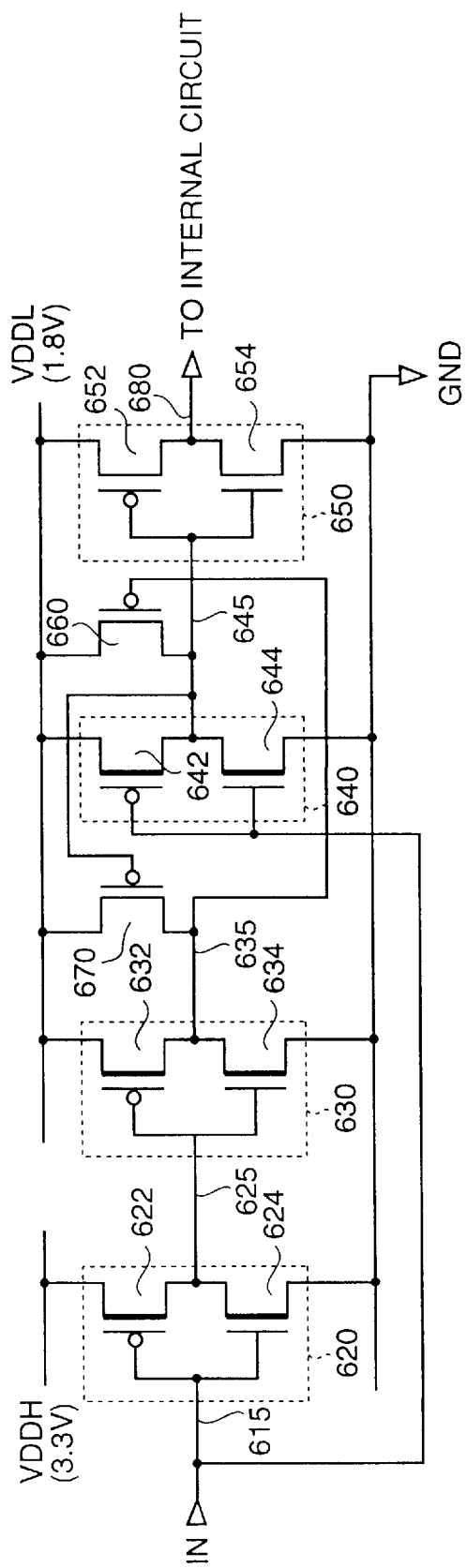
FIG. 7 is a diagram showing the configuration of an input circuit 610 according to the fourth embodiment.

Referring to FIG. 7, an input circuit 610 according to the fourth embodiment can be used in place of input circuit 600 illustrated in FIG. 2. Input circuit 610 has a level shifting function, shifts an amplitude of a high voltage VDDH (for example, 3.3 V) of an input signal IN to an amplitude of a low voltage VDDL (for example, 1.8 V), and supplies the resultant signal to internal circuit 700.

Input circuit 610 includes a signal line 615 for transmitting input signal IN having the amplitude of high voltage VDDH, inverters 620, 630, 640, and 650, PMOS transistors 660 and 670, and a signal line 680 for transmitting a resultant input signal having an amplitude of low voltage VDDL.

Inverter 620 is driven on a ground voltage (GND) and high voltage VDDH. Inverter 620 includes a PMOS transistor 622 and an NMOS transistor 624 each having a gate connected to signal line 615. Transistor 622 is connected between high voltage VDDH and a node 625, and transistor 624 is connected between the ground voltage and node 625. As transistors 622 and 624, transistors adapted to a high voltage (3.3 V) are used.

Inverter 630 is driven on the ground voltage and low voltage VDDL. Inverter 630 includes a PMOS transistor 632 and an NMOS transistor 634 each having a gate connected to node 625. Transistor 632 is connected between low voltage VDDL and a node 635, and transistor 634 is connected between the ground voltage and node 635. As transistors 632 and 634, transistors adapted to a high voltage (3.3 V) are used.

Inverter 640 is driven on the ground voltage and low voltage VDDL. Inverter 640 includes a PMOS transistor 642 and an NMOS transistor 644 each having a gate connected to signal line 615. Transistor 642 is connected between low voltage VDDL and a node 645, and transistor 644 is connected between the ground voltage and node 645. As transistors 642 and 644, transistors adapted to a high voltage (3.3 V) are used.

Inverter 650 is driven on the ground voltage and low voltage VDDL. Inverter 650 includes a PMOS transistor 652 and an NMOS transistor 654 each having a gate connected to node 645. Transistor 652 is connected between low voltage VDDL and a signal line 680, and transistor 654 is connected between the ground voltage and signal line 680. As transistors 652 and 654, transistors adapted to a low voltage (1.8 V) are used.

PMOS transistor 660 has a gate connected to node 635 and is connected between low voltage VDDL and node 645. PMOS transistor 670 has a gate connected to node 645 and is connected between low voltage VDDL and node 635. Transistors adapted to a low voltage (1.8 V) are used as transistors 660 and 670.

Inverter 620 inverts input signal IN and outputs the inverted signal with the amplitude of high voltage VDDH to node 625. In contrast, each of inverters 630, 640, and 650 outputs a signal having an amplitude of low voltage VDDL.

In consideration of process parameters and operating conditions of the inverters, in inverters 630 and 640 constructed by transistors adapted to high voltage (3.3 V) and driven on low voltage VDDL, the operating speed at the time of outputting a signal of H level (low voltage VDDL) in response to turn-on of the PMOS transistor deteriorates.

On the other hand, in inverters 630 and 640, the operating speed at the time of outputting an L-level (ground voltage) signal in response to turn-on of the NMOS transistor is assured for the reason that a signal having an amplitude of high voltage VDDH is transmitted to signal lines 615 and node 625.

The level shifting operation in input circuit 610 is executed by, basically, inverter 640 operating as an input stage of input signal IN and inverter 650 for driving the potential of signal line 680 in accordance with an output of inverter 640. When input signal IN is at the L level (ground voltage), therefore, decrease in the operating speed of inverter 640 has to be compensated.

Inverter 630 further inverts the input signal (having an amplitude of high voltage VDDH) already inverted by inverter 620 and outputs the resultant signal with the amplitude of low voltage VDDL to node 635. When input signal IN is at the L level (ground voltage), therefore, without decreasing the operating speed, node 635 is set to the L level (ground voltage).

When node 635 is set to the ground voltage, PMOS transistor 660 is turned on to thereby connect low voltage VDDL and node 645. In such a manner, the decrease in operating speed of inverter 640 can be compensated, and node 645 can be promptly increased to low voltage VDDL. Specifically, when inverter 640 sets node 645 to the H level (low voltage VDDL), inverter 630 and PMOS transistor 660 operate as a level shifting auxiliary unit for connecting node 645 and low voltage VDDL with each other in response to the inverted input signal.

With such a configuration, the driving capability of a transistor (particularly, PMOS transistor) for 3.3 V as a component of inverter 640 can be compensated. Therefore, the gate width of each of the transistors can be narrowed, and the layout area and parasitic capacity can be suppressed.

By driving the potential of the output node of the inverter at the input stage by using the input signal and the signal obtained by inverting the input signal, the voltage level of the input signal can be shifted at high speed.

On the other hand, when input signal IN is at the H level (high voltage VDDL), that is, when inverter 640 sets node 645 to the L level (ground voltage), PMOS transistor 632 is turned on. Consequently, the operating speed of inverter 630 decreases. On the other hand, in inverter 640, NMOS transistor 644 is turned on at high speed, so that the operating speed does not decrease. As a result, when the turn-off of PMOS transistor 660 is delayed, there is the possibility that a leak current occurs.

PMOS transistor 670 is turned on when inverter 640 sets node 645 to the L level (ground voltage) to connect node 635, that is, the gate of PMOS transistor 660 to low voltage VDDL. In response to this, PMOS transistor 660 is turned off.

Consequently, in the case where input signal IN is at the H level (high voltage VDDL) as the case where the operating speed of inverter 640 does not decrease, by promptly turning off PMOS transistor 660 for raising the level of node 645 to the H level (low voltage VDDL) at high speed, occurrence of a leak current can be prevented.

As described above, in the input circuit according to the fourth embodiment, without internally causing a leak current, the input signal having the amplitude of high voltage can be changed to the input signal having the amplitude of low voltage at high speed. Further, the input signal does not have to be a complementary signal. The level of a single input signal can be also shifted at high speed.

Alternately, in the case of using complementary signals as input signals, by supplying the complementary signals to signal line 615 and node 625, inverter 620 may be omitted. In this case, it is sufficient to dispose input circuit 610 for each of the complementary signals and set the corresponding relation between signal line 615 and node 625 with the complementary signal in one of input circuit 610 so as to be opposite to that in the other input circuit 610.

As described above, in the semiconductor integrated circuit according to the invention, the MOS transistors which are cross coupled are disposed for the signal lines L1 and L2 for transmitting signals which are complementary to each other. The potentials of the signal lines L1 and L2 can be driven at high speed by the transistors.

Even when a timing deviation occurs between complementary signals, in response to a change in potential of one of the signal lines, the potential of the other signal line can be changed by the cross-coupled MOS transistors. Thus, the timing deviation between the complementary signals can be corrected.

Further, front-stage gates connected at the front stage of the signal lines L1 and L2, rear-stage gates connected at the rear stage of the signal lines L1 and L2, and MOS transistors which are cross coupled are produced under different process parameters.

For example, a transistor having a thick gate oxide film is used for the front-stage gate, and transistors each having a thin gate oxide film are used as the rear-stage gates and the cross coupled MOS transistors. Alternately, a transistor whose withstand voltage is higher than that each of the rear-stage gates and the cross coupled MOS transistors is used for the front-stage gate. Even when the drivability of the front-stage gate is low, it can be compensated by the MOS transistors cross coupled. Consequently, the gate width of each of the transistors constructing the front-stage gates can be narrowed, and the layout area and the parasite capacitance can be reduced. Signals can be certainly transmitted while decreasing the voltage level without widening the layout area.

Further, as transistors to be cross coupled, PMOS transistors, NMOS transistors, or a PMOS transistor and an NMOS transistors can be used. As a result, the potentials of two signal lines for transmitting complementary signals can be driven by utilizing the characteristics of the MOS transistors.

In the semiconductor integrated circuit having the other configuration of the invention, even when input signal IN of a voltage level by which the operating speed of the inverter at the input stage decreases is input, in response to an inverted input signal, the potential of the output node of the inverter at the input stage can be driven by the MOS transistor. With the configuration, the level of the input signal can be shifted at high speed. The driving capability of the MOS transistor as a component of the input stage can be also compensated. Consequently, the gate width of the MOS transistor can be narrowed, so that the layout area and parasitic capacity can be suppressed. The invention can be also applied to the case where an input signal is not a complementary signal.

Further, in the case where input signal IN of a voltage level by which the operating speed of the inverter at the input stage does not decrease is input, the MOS transistor for driving the potential of the output node of the inverter at the input stage can be promptly turned off, so that occurrence of a leak current can be prevented.

Although the present invention has been described and illustrated in detail, it is clearly understood that the same is by way of illustration and example only is not to be taken by way of limitation, the spirit and scope of the present invention being limited only by the terms of the appended claims.

What is claimed is:

1. A semiconductor integrated circuit comprising:
   first and second signal lines;
   a first logic gate receiving first and second power supply voltages and outputting a first logic signal to said first signal line in response to a first input signal;
   a second logic gate receiving said first and second power supply voltages and outputting a second logic signal substantially complementary to said first logic signal to said second signal line in response to a second input signal; and
   first and second MOS transistors cross coupled between said first and second signal lines,
   wherein said first logic gate includes a third MOS transistor receiving the first input signal at a gate thereof and having a withstand voltage greater than that of each of said first and second MOS transistors, and
   said second logic gate includes a fourth MOS transistor receiving the second input signal at a gate thereof and having a withstand voltage greater than that of each of said first and second MOS transistors.

2. The semiconductor integrated circuit according to claim 1, wherein said first and second MOS transistors are PMOS transistors,
   said first MOS transistor is connected between a power supply voltage line and said first signal line and a gate of said first MOS transistor is connected to said second signal line, and
   said second MOS transistor is connected between said power supply voltage line and said second signal line and a gate of said second MOS transistor is connected to said first signal line.

3. The semiconductor integrated circuit according to claim 1, wherein said first and second MOS transistors are NMOS transistors,
   said first MOS transistor is connected between a ground voltage line and said first signal line and a gate of said first MOS transistor is connected to said second signal line, and
   said second MOS transistor is connected between said ground voltage line and said second signal line and a gate of said second MOS transistor is connected to said first signal line.

4. The semiconductor integrated circuit according to claim 1, wherein
   said first logic gate includes a fifth MOS transistor of a conductive type opposite to that of said third MOS transistor, said fifth MOS transistor and said third MOS transistor forming a first CMOS inverter,
   said second logic gate includes a sixth MOS transistor of a conductive type opposite to that of said fourth MOS transistor, said sixth MOS transistor and said fourth MOS transistor forming a second CMOS inverter,
   said semiconductor integrated circuit further comprising:
   a first terminal for receiving said first logic signal;
   a second terminal for receiving said second logic signal;
   a third logic gate including a seventh MOS transistor which is connected between said first terminal and said first signal line and a eighth MOS transistor of a conductive type opposite to that of said seventh MOS transistor, said seventh MOS transistor and said eighth MOS transistor forming a third CMOS inverter; and
   a fourth logic gate including a ninth MOS transistor which is connected between said second terminal and said second signal line and a tenth MOS transistor of a conductive type opposite to that of said ninth MOS transistor, said ninth MOS transistor and said tenth MOS transistor forming a fourth CMOS inverter.

5. A semiconductor integrated circuit comprising:
   a first signal line for transmitting an input signal set to have a first or second voltage;
   a second signal line for transmitting an level-shifted input signal which is set to have a second or third voltage;
   a first logic gate driven on the second and third voltages, for connecting one of the second and third voltages to a first node in response to said input signal;
   a level shifting auxiliary unit which operates in response to an inverted input signal and is activated when said first node and said third voltage are connected to each other by said first logic gate, to connect said third voltage and said first node; and
   a second logic gate driven on said second and third voltages, for connecting one of said second and third voltages to said second signal line in accordance with a voltage at said first node; wherein
   each of said first logic gate and said level shifting auxiliary unit include a MOS transistor, and
   the MOS transistor included in said first logic gate have a withstand voltage greater than that of the MOS transistor included in said level shifting auxiliary unit.

6. A semiconductor integrated circuit comprising:
   a first signal line for transmitting an input signal set to have a first or second voltage;
   a second signal line for transmitting a level-shifted input signal which is set to have a second or third voltage;
   a first logic gate driven on the second and third voltages, for connecting one of the second and third voltages to a first node in response to said input signal;
   a level shifting auxiliary unit operating in response to an inverted input signal,
   said level shifting auxiliary unit being activated when said input signal has a level at which said first node and said third voltage are connected to each other by said first logic gate, to connect said third voltage and said first node,
   said level shifting auxiliary unit being inactivated when said input signal has another level at which said first node and said second voltage are connected to each other by said first logic gate, to disconnect said third voltage and said first node;
   a second logic gate driven on said second and third voltages, for connecting one of said second and third voltages to said second signal line in accordance with a voltage at said first node; and
   a leak current preventing unit for assisting inactivation of said level shifting auxiliary unit according to a voltage of said first node.

7. The semiconductor integrated circuit according to claim 5, further comprising a third logic gate driven by said first and second voltages, for inverting said input signal, wherein
   said first voltage is higher than said third voltage.

8. A semiconductor integrated circuit comprising:
a first signal line for transmitting an input signal set to have a first or second voltage;
a second signal line for transmitting an level-shifted input signal which is set to have a second or third voltage;
a first logic gate driven on the second and third voltages, for connecting one of the second and third voltages to a first node in response to said input signal, said first logic gate includes a first MOS transistor for receiving said input signal by its gate;
a level shifting auxiliary unit which operates in response to an inverted input signal and is activated when said first node and said third voltage are connected to each other by said first logic gate, to connect said third voltage and said first node; and
a second logic gate driven on said second and third voltages, for connecting one of said second and third voltages to said second signal line in accordance with a voltage at said first node, said second logic gate includes a second MOS transistor having a gate connected to said first node,
wherein said level shifting auxiliary unit includes,
 a third logic gate for connecting said third or second voltage and a second node in accordance with the inverted input signal, and
 a third MOS transistor which has a gate connected to said second node and is connected between said third voltage and said first node,
 said third logic gate has a fourth MOS transistor for receiving the inverted input signal by its gate, and
 said first and fourth MOS transistors and said second and third MOS transistors are formed under different process parameters.

9. A semiconductor integrated circuit comprising:
a first signal line for transmitting an input signal set to have a first or second voltage;
a second signal line for transmitting an level-shifted input signal which is set to have a second or third voltage;
a first logic gate driven on the second and third voltages, for connecting one of the second and third voltages to a first node in response to said input signal, said first logic gate includes a first MOS transistor for receiving said input signal by its gate;
a level shifting auxiliary unit which operates in response to an inverted input signal and is activated when said first node and said third voltage are connected to each other by said first logic gate, to connect said third voltage and said first node; and
a second logic gate driven on said second and third voltages, for connecting one of said second and third voltages to said second signal line in accordance with a voltage at said first node, said second logic gate includes a second MOS transistor having a gate connected to said first node,
wherein said level shifting auxiliary unit includes,
 a third logic gate for connecting said third or second voltage and a second node in accordance with the inverted input signal, and
 a third MOS transistor which has a gate connected to said second node and is connected between said third voltage and said first node,
 said third logic gate has a fourth MOS transistor for receiving the inverted input signal by its gate, and
 said first and fourth MOS transistors and said second and third MOS transistors are formed under different process parameters,
wherein the thickness of a gate oxide film of each of said first and fourth MOS transistors is different from that of each of said second and third MOS transistors.

10. A semiconductor integrated circuit comprising:
a first signal line for transmitting an input signal set to have a first or second voltage;
a second signal line for transmitting an level-shifted input signal which is set to have a second or third voltage;
a first logic gate driven on the second and third voltages, for connecting one of the second and third voltages to a first node in response to said input signal, said first logic gate includes a first MOS transistor for receiving said input signal by its gate;
a level shifting auxiliary unit which operates in response to an inverted input signal and is activated when said first node and said third voltage are connected to each other by said first logic gate, to connect said third voltage and said first node; and
a second logic gate driven on said second and third voltages, for connecting one of said second and third voltages to said second signal line in accordance with a voltage at said first node, said second logic gate includes a second MOS transistor having a gate connected to said first node,
wherein said level shifting auxiliary unit includes,
 a third logic gate for connecting said third or second voltage and a second node in accordance with the inverted input signal, and
 a third MOS transistor which has a gate connected to said second node and is connected between said third voltage and said first node,
 said third logic gate has a fourth MOS transistor for receiving the inverted input signal by its gate, and
 said first and fourth MOS transistors and said second and third MOS transistors are formed under different process parameters,
wherein a withstand voltage of each of said first and fourth MOS transistors is different from that of each of said second and third MOS transistors.

11. A semiconductor integrated circuit comprising:
a first signal line for transmitting an input signal set to have a first or second voltage;
a second signal line for transmitting an level-shifted input signal which is set to have a second or third voltage;
a first logic gate driven on the second and third voltages, for connecting one of the second and third voltages to a first node in response to said input signal, said first logic gate includes a first MOS transistor for receiving said input signal by its gate;
a level shifting auxiliary unit which operates in response to an inverted input signal and is activated when said first node and said third voltage are connected to each other by said first logic gate, to connect said third voltage and said first node;
a second logic gate driven on said second and third voltages, for connecting one of said second and third voltages to said second signal line in accordance with a voltage at said first node, said second logic gate includes a second MOS transistor having a gate connected to said first node,
wherein said level shifting auxiliary unit includes,
 a third logic gate for connecting said third or second voltage and a second node in accordance with the inverted input signal, and
 a third MOS transistor which has a gate connected to said second node and is connected between said third voltage and said first node, said third logic gate has a fourth MOS transistor for receiving the inverted input signal by its gate, and said first and fourth MOS transistors and said second and third MOS transistors are formed under different process parameters; and a fifth MOS transistor which has a gate connected to said first node and is connected between said third voltage and said second node, wherein said third and fifth MOS transistors are turned on/off complementarily to each other, wherein said fifth MOS transistor is formed under process parameters similar to those of said third MOS transistor.

12. A semiconductor integrated circuit comprising:

a first signal line for transmitting an input signal set to have a first or second voltage;

a second signal line for transmitting an level-shifted input signal which is set to have a second or third voltage;

a first logic gate driven on the second and third voltages, for connecting one of the second and third voltages to a first node in response to said input signal, said first logic gate includes a first MOS transistor for receiving said input signal by its gate;

a level shifting auxiliary unit which operates in response to an inverted input signal and is activated when said first node and said third voltage are connected to each other by said first logic gate, to connect said third voltage and said first node;

a second logic gate driven on said second and third voltages, for connecting one of said second and third voltages to said second signal line in accordance with a voltage at said first node, said second logic gate includes a second MOS transistor having a gate connected to said first node, wherein said level shifting auxiliary unit includes, a third logic gate for connecting said third or second voltage and a second node in accordance with the inverted input signal, and a third MOS transistor which has a gate connected to said second node and is connected between said third voltage and said first node, said third logic gate has a fourth MOS transistor for receiving the inverted input signal by its gate, and said first and fourth MOS transistors and said second and third MOS transistors are formed under different process parameters; and a fifth MOS transistor which has a gate connected to said first node and is connected between said third voltage and said second node, wherein said third and fifth MOS transistors are turned on/off complementarily to each other, wherein said fifth MOS transistor is formed under process parameters similar to those of said third MOS transistor.

13. The semiconductor integrated circuit according to claim 5, wherein said first and second logic gates are inverters.

14. The semiconductor integrated circuit according to claim 1 further comprising:

a third logic gate receiving said first power supply voltage and a third power supply voltage greater than said first and second power supply voltages and generating the second input signal having a complementary logic to said first input signal, said third logic gate including a fifth MOS transistor receiving the first input signal at a gate thereof and having a withstand voltage greater than that of each of said first and second MOS transistors.

15. The semiconductor integrated circuit according to claim 1, further comprising:

a first voltage transforming circuit receiving said first power supply voltage, a third power supply voltage greater than said first and second power supply voltage, and a first signal and for dropping a high level voltage of the first signal to provide the first input signal with said first logic gate; and a second voltage transforming circuit receiving said first and third power supply voltages, and a second signal complementary to the first signal and for dropping a high level voltage of the second signal to provide the second input signal with said second logic gate.

* * * * *